(12) United States Patent
Morrill

(10) Patent No.: US 6,344,958 B1
(45) Date of Patent: Feb. 5, 2002

(54) OVERVOLTAGE PROTECTION CIRCUIT WITH OVERVOLTAGE REMOVAL SENSING

(75) Inventor: David P. Morrill, Scarborough, ME (US)

(73) Assignee: Fairchild Semiconductor Corp., South Portland, ME (US)

( * ) Notice: Subject to any disclaimer, the term of this patent is extended or adjusted under 35 U.S.C. 154(b) by 0 days.

(21) Appl. No.: 09/501,869

(22) Filed: Feb. 10, 2000

(51) Int. Cl.[7] .................................................. H02H 3/20
(52) U.S. Cl. ...................................................... 361/91.5
(58) Field of Search .............................. 361/91.1, 91.5, 361/111, 56; 327/309, 310, 108; 326/58, 81, 68, 83, 103

(56) References Cited

U.S. PATENT DOCUMENTS

| | | | |
|---|---|---|---|
| 4,543,494 A | * 9/1985 | Wakimoto | 327/108 |
| 5,160,855 A | * 11/1992 | Dobberpuhl | 327/108 |
| 5,654,858 A | 8/1997 | Martin et al. | 361/56 |
| 6,097,237 A | * 8/2000 | Singh | 327/389 |
| 6,181,542 B1 | * 1/2001 | Liang et al. | 361/111 |

* cited by examiner

*Primary Examiner*—Michael J. Sherry
(74) *Attorney, Agent, or Firm*—Pierce Atwood

(57) ABSTRACT

An overvoltage protection circuit arranged to sense removal of the overvoltage condition. The protection circuit blocks current passing through a pull up transistor of an output circuit to a high-potential supply rail during an overvoltage condition applied at a common bus. The protection circuit includes one protection branch controlled by the potential at the bus and powered by the high-potential supply rail of the output circuit to be protected. The protection circuit also includes a second protection branch controlled by the high-potential supply rail and powered by the potential on the bus. When an overvoltage condition occurs, the second branch is activated and regulates an output from the first protection branch. That output signal controls the control node of the pull up transistor of the output circuit to be protected. The two protection branches are configured such that removal of the overvoltage condition causes a rapid changing of the state of the output of the first protection branch so that the operating condition of the pull up transistor remains the same as it was prior to the overvoltage condition.

9 Claims, 3 Drawing Sheets

OVERVOLTAGE PROTECTION CIRCUIT WITH OVERVOLTAGE REMOVAL SENSING

BACKGROUND OF THE INVENTION

1. Field of the Invention.

The present invention relates to output circuitry having active overvoltage protection. More particularly, the present invention relates to circuitry having an output coupled to a common bus which bus may experience signal potentials exceeding the signal potential associated with the output circuitry. The present invention is an output control circuit having overvoltage protection and means for detecting an overvoltage condition as well as the removal of an overvoltage condition on the common bus and ensuring that the output signal of the output circuitry is maintained through the transition from the overvoltage condition.

2. Description of the Prior Art.

Electrical signal transmission circuits are used to transfer electrical signals of desired amplitude and strength. Signals are transferred from one sub-system to another by way of interfaces, i.e., buses, that couple active devices together. Increasingly, the active devices may not be powered at equivalent potentials. That is, some may be powered by a supply at a nominal level of 5.0 volts, some at a nominal 3.3 volts, and still others at a nominal 2.2 volts.

The systems may be located proximate to one another, or they may be some distance from one another. One example of a proximate system interface requiring one or more bus connections is the coupling of one printed circuit board to another within a computing system, such as through a backplane bus. An example of a remote system interface requiring one or more bus connections is the coupling of one computing system to another, such as through a telephone transmission line that is, effectively, a voice/data bus. More generally, any system used to transfer electrical signals from one point to another, whether digital or analog, requires some arrangement for ensuring that the transfer occurs as smoothly as possible when desired.

As indicated, signal transmission circuits are used to ensure that electrical signals are transferred as accurately and as quickly as possible. Among other means, signal propagation may be established using solid state devices such as semiconductor structures. In particular, metal oxide semiconductor (MOS) active devices are often employed for this purpose. When P-type MOS (PMOS) structures are used in combination with N-type MOS (NMOS) structures in a complementary MOS (CMOS) arrangement, logic HIGH and logic LOW signals may be propagated through the circuit. In a CMOS output circuit, the PMOS transistor, when on, is the pullup transistor that establishes a logic HIGH at the output of the CMOS-based output circuit. When the PMOS transistor is off and the NMOS transistor is on, the NMOS transistor acts as a pulldown transistor that establishes a logic LOW at the output of the CMOS-based output circuit. For CMOS-based logic, for example, a logic HIGH corresponds to a nominal 5.0-volt potential (for a 5.0V power supply) and a nominal 3.3-volt potential (for a 3.3V power supply), while a logic LOW is essentially equivalent to ground (GND) or 0.0-volt.

The potentials associated with HIGH and LOW signals described above are idealized values. In fact, HIGHS and LOWS generally fall within a range of potentials associated with the indicated values. Thus, for a 3.3-volt supply, a HIGH signal may be supplied at 2.6V, for example, while a LOW signal may actually be associated with a 0.7V value. As the potentials of the power supplies used to power circuitry move closer to GND, variations in the potentials applied to those devices take on greater importance. For example, a PMOS transistor powered by a 3.3-volt supply and having an output coupled to a common bus that also has coupled to it an active device powered at 5.0V may experience a significant overvoltage event. That is, the bus may be dominated by a 5.0V nominal potential so that the drain of the PMOS transistor is at a potential substantially higher than the potential of its source and bulk (back gate), which are generally the same. The result is an undesirable current passing from the bus to the power supply of the pullup transistor. Further, a significant overvoltage condition at the pullup transistor's drain can create an unexpected turning on of that transistor when it is expected to be off. It is therefore of great interest to ensure that the pull up transistor will remain at its selected state during an overvoltage condition at the output of the output circuit.

In order to address this potential problem during an overvoltage condition, overvoltage sense circuits have been developed in order to maintain the pull up transistor in its selected state. In U.S. Pat. No. 5,654,858 issued to Martin et al., a solution for this condition is disclosed. Specifically, Martin apparently establishes a pseudo supply rail that provides to the gate of the pull up transistor a potential matching the greater of the supply potential and the bus potential. In that way, the off state of that transistor is apparently ensured. In an alternative arrangement, Martin creates a blocking sub-circuit that is intended to block an overvoltage signal at the bus from passing back through the pull up transistor.

Unfortunately, the Martin and other overvoltage protection devices generally rely upon the formation and operation of supplemental devices that can slow the signal propagation effort or that otherwise simply consume chip space. A fairly simple solution to the overvoltage problem is to couple a sense inverter between the output node and ground. The sense inverter detects the overvoltage condition and pulls the higher potential associated with that condition away from the drain of the pull up transistor to be protected. In particular, it turns off the pull up transistor to ensure that there is no current conduction from the bus-tied output node to the supply for the pull-up transistor. That is designed to occur when the potential at the bus exceeds a threshold turn-on voltage $V_t$ of the PMOS transistor.

However, while such a sense device achieves the goal of blocking current from the bus to the high-potential supply of the output circuit, during an overvoltage condition, it has a specific undesirable characteristic. As indicated, the sense inverter coupled to the output node of the output circuit will protect during overvoltage conditions. However, when the pull up transistor is required to be on and maintaining a logic HIGH potential $V_{OH}$ associated with its supply potential, the removal of an overvoltage condition from the bus is not detected immediately and the pull up transistor remains in an off (protected) state. Instead, there is a lag during which the sense circuit continues to control the condition of the pull up transistor in an off state. Only when that control is removed is the pull up transistor turned back on in a manner that provides for the propagation of a logic HIGH signal to the bus. Such a delay is undesirable, particularly when a general goal in semiconductor device operation is faster propagation. Further, under such conditions, an out-of-state logic state could be generated, another undesirable event.

Therefore, what is needed is a protection circuit that detects overvoltage conditions affecting current through the pull up transistor and turns off that pull up transistor. What is also needed is such a protection circuit with overvoltage protection that detects when the overvoltage condition has been removed. Further, what is needed is such a protection circuit that detects the removal of the overvoltage condition and minimizes the delay in turning the pull up transistor back on.

SUMMARY OF THE INVENTION

It is an object of the present invention to provide a protection circuit that detects overvoltage conditions affecting current through the pull up transistor and turns off that pull up transistor. It is a further object of the present invention to provide a protection circuit with overvoltage protection that detects when the overvoltage condition has been removed. It is also an object of the present invention to provide such a protection circuit that detects the removal of the condition and minimizes the delay in turning the pull up transistor back on.

These and other objects are achieved in the present invention, which is an output circuit protection circuit designed to minimize the impact on the output circuit operation caused by an overvoltage condition. The protection circuit is couplable between the pull-up transistor of the output circuit to be protected and the output node of that circuit, wherein the output node is coupled to a bus. That bus may be coupled to other circuitry having power supplies exceeding the power supply associated with the output circuit to be protected. Logic control coupled to the sense circuit and the pull up transistor and the pull down transistor generates a signal, based on a signal from the sense circuit that acts to turn off the pull up transistor when an overvoltage condition occurs. It does so by driving the gate of that transistor to the higher potential sensed by the sense circuit.

The protection circuit includes a first protection branch and a second protection branch that act together to sense when the potential at the output node exceeds the supply potential of the output circuit plus a $V_t$. Those protection branches further act together to transmit a turn-off signal to the pull up transistor. When the overvoltage condition declines, the two branches act to turn the pull up transistor back on virtually when the output node potential reaches a potential equivalent to the high-potential supply rail potential minus a $V_t$.

The first protection branch preferably includes an output that propagates the sense signal output used to control the condition of the gate of the pull up transistor of the output circuit to be protected. The first protection branch includes a component controlled by the bus-tied output signal and is supplied by the high-potential rail of the circuit to be protected. On the other hand, the second protection branch includes a component controlled by that same high-potential rail and is supplied by the potential of the bus-tied output signal. Together, they act like a comparator in that one branch controls the output sense signal for an overvoltage condition and the other when that condition does not exist. When there is no overvoltage condition, the first branch ensures that the sense signal output by the protection circuit does not interfere with the ordinary operation of the pull up transistor. When the output node exceeds the high-potential rail potential plus a threshold drop, the second protection branch becomes operational and controls the output of a logic signal that forces the pull up transistor off.

A potential-drop component of the first protection branch provides a means by which the protection circuit quickly turns the pull up transistor back on when the overvoltage condition ceases. Specifically, the potential-drop component is preferably a resistive device that tracks the change in potential at the output node as that change occurs. As soon as a threshold potential change is reached sufficient to change the state of a MOS transistor, the sense signal that is output by the protection circuit acts to turn the pull up transistor back on. The rate at which that occurs is substantially faster than exists with current overvoltage protection devices.

The overvoltage protection circuit of the present invention includes a pair of protection branches that generate a signal to turn off a pull up transistor of a circuit to be protected when an overvoltage detection occurs. They also act to turn the pull up transistor back on when that overvoltage condition is released. These and other advantages of the present invention will become apparent upon review of the detailed description, the accompanying drawings, and the appended claims.

DESCRIPTION OF THE PREFERRED EMBODIMENT OF THE INVENTION

Figure 1:
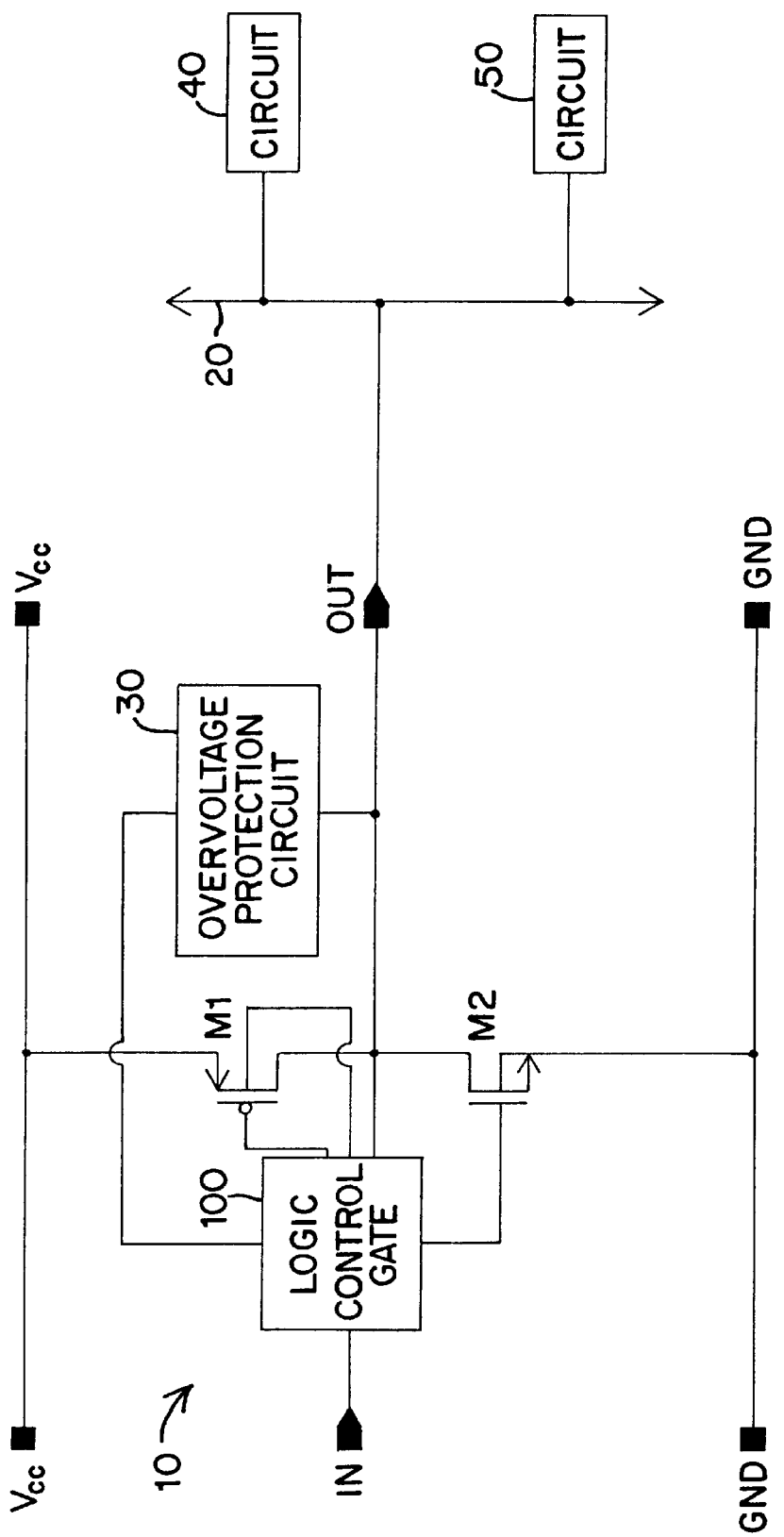
FIG. 1 is a simplified circuit diagram showing the overvoltage protection circuit of the present invention coupled to an output circuit that is in turn coupled to a common bus.

An output circuit 10 having pull up PMOS transistor M1 and pull down NMOS transistor M2 is shown in FIG. 1 coupled to a common bus 20. The output circuit 10 includes an input node IN for receiving an electrical signal to be transmitted to the bus 20 via output node OUT. Transistor M1 has a gate coupled through a control logic gate 100 to IN, a source coupled to high-potential power rail $V_{cc}$, a drain coupled to OUT, and a bulk region also coupled to the control gate 100. Transistor M2 has a gate also coupled to IN through control gate 100, a source coupled to low-potential power rail GND, and a drain coupled to OUT. The circuit 20 further includes overvoltage protection circuit 30 coupled through the logic gate 100 to the gate of M1 and the output node OUT. Although the output circuit 10 is shown in FIG. 1 as a MOS-based output device, it is to be understood that the protection circuit 30 of the present invention may be used with bipolar and mixed MOS-bipolar output circuits that require maintenance of $V_{OH}$ when desired, including during overvoltage conditions at OUT.

For the purpose of the present invention, logic gate 100 may be any sort of logic control device suitable for comparing the higher of two signal potentials and passing that signal to the gate of transistor M1. In that way, the sensed signal from circuit 30 is reliably passed to the gate of M1 to ensure its turn off for an overvoltage condition at the output node OUT. For that reason, the logic control gate 100 is also coupled to OUT in order to sense and compare the potential associated with that node.

With continuing reference to FIG. 1, it is preferable to include protection circuit 30 with the output circuit 10 in order to block overvoltage events at the bus 20 from causing current transmission from the output node OUT tied to the bus 20 back to $V_{cc}$ when the potential on the bus 20 exceeds the potential associated with $V_{cc}$. This may occur, for example, when one or more other circuits, such as those represented by block 40 and block 50 are supplied by power supplies having potentials greater than the potential associated with $V_{cc}$. Protection circuit 30 is designed to ensure that M1 is turned off during such an overvoltage condition at OUT and that it is turned back on as soon as possible after the overvoltage is removed from the bus 20.

Figure 2:
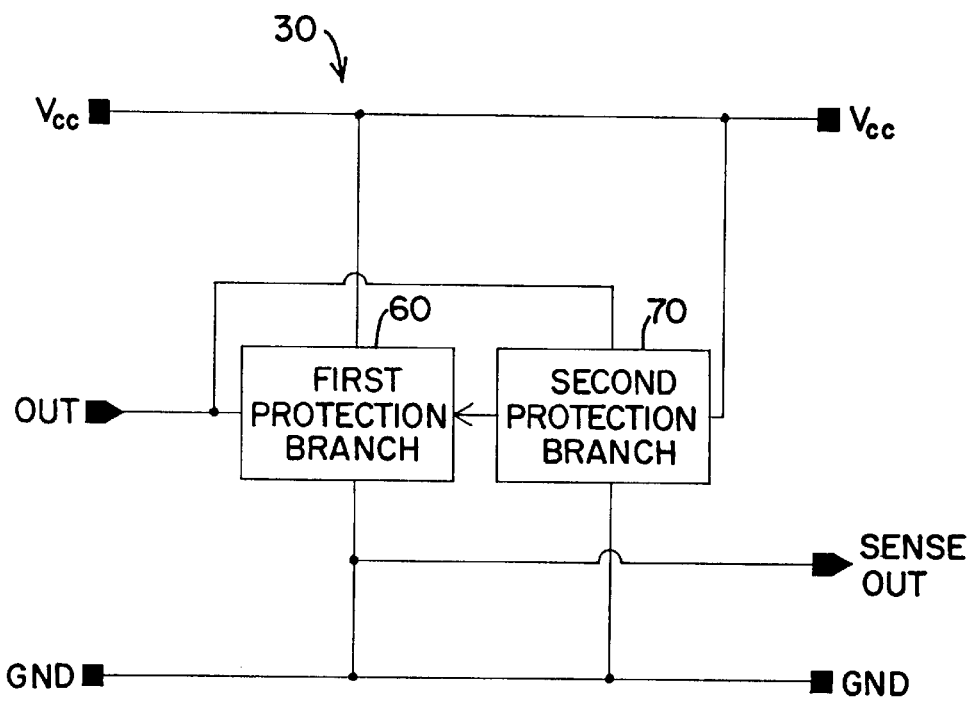
FIG. 2 is a simplified circuit diagram showing the overvoltage protection circuit of the present invention in block form.

As illustrated in FIG. 2, the overvoltage protection circuit 30 of the present invention includes a first protection branch 60 and a second protection branch 70. The first branch 60 is powered by $V_{cc}$ and controlled by the signal from the output node OUT tied to the bus 20. The output of first branch 60 is coupled to the gate of M1 through control gate 100 at SENSE OUT. The second branch 70 is powered by the signal from the output node OUT tied to the bus 20 and is controlled by $V_{cc}$. The output of second branch 70 is coupled to first branch 60 such that when the potential at OUT exceeds the potential of $V_{cc}$, the second branch 70 activates the first branch 60 in a manner that changes the output signal transmitted by the protection circuit 30 to logic gate 100. First branch 60 and second branch 70 are further designed such that when the potential at OUT drops to a level approximating that of $V_{cc}$, second branch 70 is no longer operative and the output of the first branch 60 returns to its original condition when there is no overvoltage condition at OUT.

Figure 3:
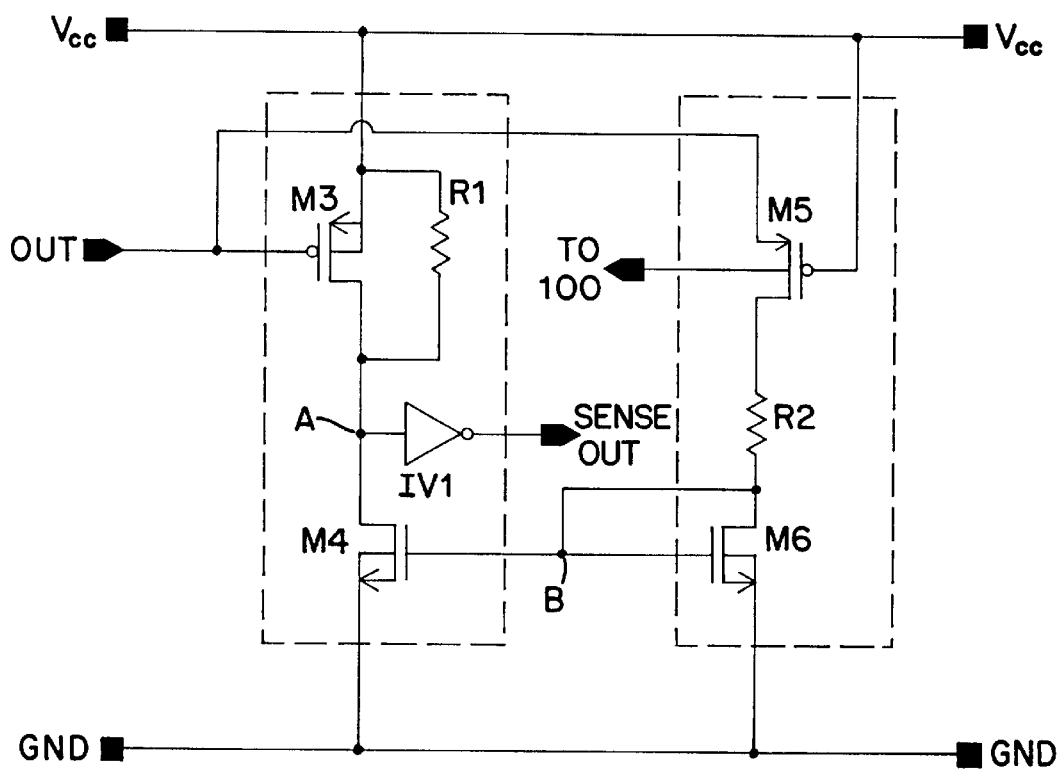
FIG. 3 is a simplified circuit diagram of a preferred embodiment of the overvoltage protection circuit of the present invention.

A preferred design of the overvoltage protection circuit 30 is illustrated in FIG. 3. The protection circuit 30 includes in first branch 60 PMOS transistor M3 coupled in parallel with a resistance component such as resistor R1, and NMOS transistor M4 coupled in series with M3, R1. Transistor M3 has a gate coupled to OUT, a source coupled to $V_{cc}$, and a drain that is the output of the first branch 60 at node A tied to the gate of pull up transistor M1 of circuit 10. Resistor R1 has a high-potential node coupled to $V_{cc}$ and a low-potential node coupled to node A. Transistor M4 has a source coupled to GND, a drain coupled to node A, and a gate coupled to the output of second branch 70 at node B.

With continuing reference to FIG. 3, second branch 70 includes PMOS transistor M5 coupled in series with NMOS transistor M6. An optional current limiting resistance represented by resistor R2 may be inserted between the two transistors of the second branch 70 if deemed necessary. Transistor M5 has a gate coupled to $V_{cc}$, a source coupled to OUT and a drain coupled either to node B, the output of the second branch 70, or to the high-potential node of optional current-limiting resistor R2. Transistor M5 further has a bulk coupled to the control logic gate 100 as part of the overvoltage sensing process. Transistor M6 is a diode-connected transistor having its gate and drain coupled to node B and its source coupled to GND.

In operation, the overvoltage protection circuit 30 of FIG. 3 when coupled between the gate of pull up transistor M1 and output node OUT of FIG. 1 as shown blocks current from OUT to $V_{cc}$ during overvoltage conditions at OUT when M1 is on. When the controlling signal at the gate of M1 from IN is a logic HIGH, M1 is off and overvoltage current flow does not occur. However, when IN is a logic LOW and M1 is therefore ordinarily conducting, an overvoltage condition at OUT will cause an undesired current to pass to $V_{cc}$. When the gate of M1 is LOW and there is no overvoltage condition at OUT, transistors M3 and M5 are off. Since M5 is off, transistors M4 and M6 are also off and the potential at node A, the output of protection circuit 30 tied to control logic 100 and, therefore, the gate of M1, is simply the potential associated with $V_{cc}$ minus the drop across R1. Inverter IV1 coupled between node A and the SENSE OUT node thereby delivers a logic LOW signal that is transferred to the gate of M1. It is to be noted that IV1 must be coupled in the circuit such that it is powered by the greater of the potentials associated with the potentials of $V_{cc}$ and OUT. This may be achieved using a logic gate similar to the control gate 100.

When the signal potential at OUT exceeds the potential of $V_{cc}$ by at least the threshold potential of a MOS transistor, transistor M3 remains off, transistor M5 turns on, and so transistors M4 and M6 also turn on. As a result, the potential at node A drops to that of GND. A logic HIGH is then imparted through inverter IV1 and logic gate 100 to the gate of M1, turning that pull up transistor off and thereby blocking current from OUT to $V_{cc}$. When the overvoltage condition at OUT is removed, transistor M5 immediately turns off and the potential associated with node A immediately jumps up to $V_{cc}$ less the potential across R1. The signal passed to the gate of M1 effects a turn on of that transistor shortly thereafter and normal operating conditions of the output circuit 10 resume much faster than when using prior overvoltage protection devices. Importantly, it ensures that a logic HIGH to be transmitted by the output circuit 10 is maintained when coming out of the overvoltage protection condition so that continuity of signal is not lost.

Figure 4:
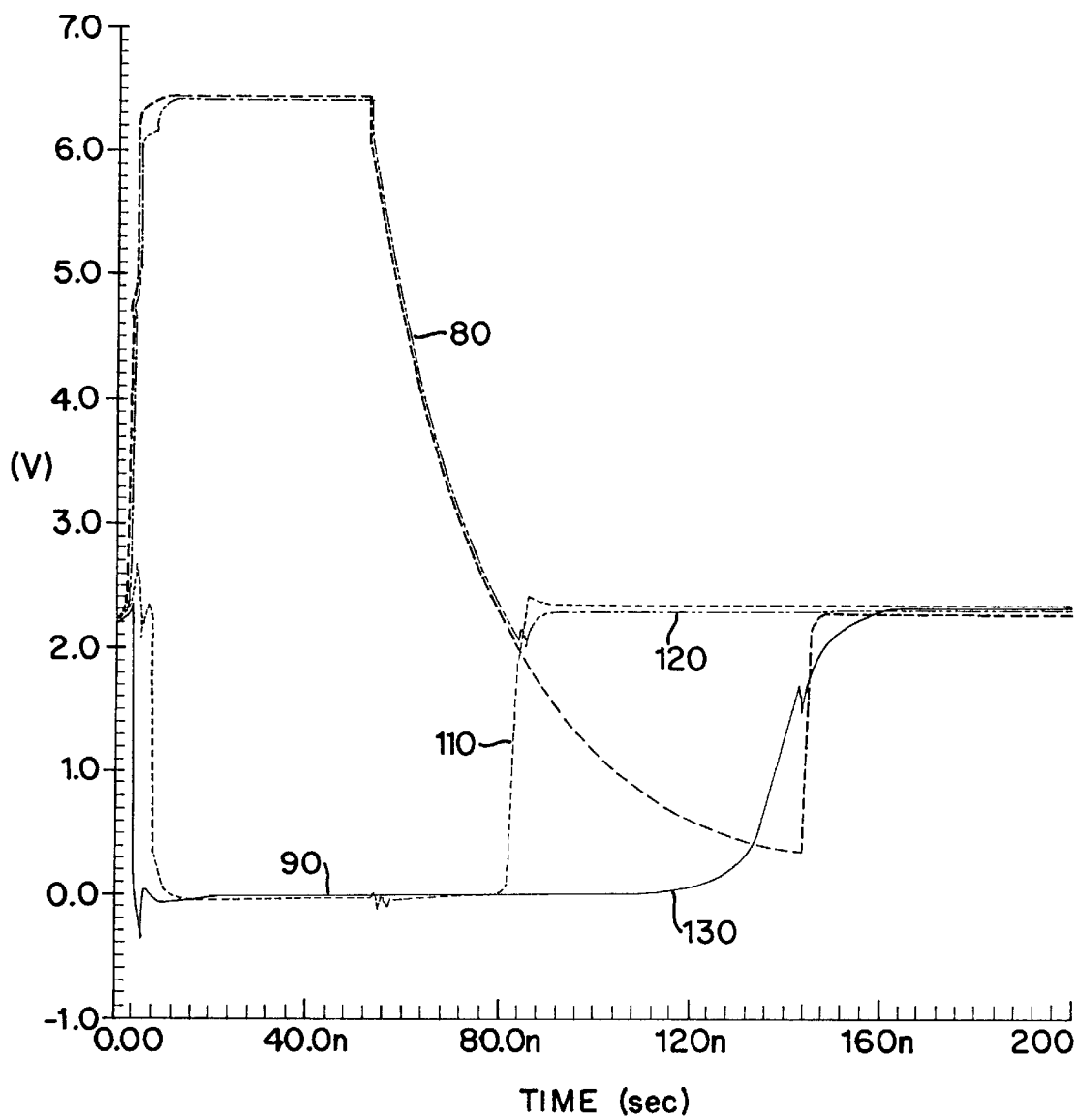
FIG. 4 is a waveform diagram comparing the operating characteristics of the overvoltage protection circuit of the present invention in comparison to an overvoltage protection circuit of the prior art.

The advantage obtained by using the overvoltage protection circuit 30 of FIG. 3 can be seen in the waveforms of FIG. 4. FIG. 4 represents simulations of the responses of an output circuit coupled to a bus, wherein the output circuit includes a prior overvoltage protection circuit and the overvoltage protection circuit 30 of the present invention. The potential associated with OUT for an output circuit protected by the prior art and by the protection circuit 10 of the present invention is represented by curve 80 for a pull up transistor powered by a nominal 2.2 volt supply. Curve 90 represents the output of the protection circuit that acts to turn off the pull up transistor when the overvoltage condition occurs. Both the prior art protection circuit and the protection circuit 10 of the present invention respond in substantially the same period of time as the potential at OUT quickly reaches about 5.0 volts.

As the overvoltage condition drops from a high of more than 6.0 volts, the responses of the two protection circuits differs significantly. Specifically, when the potential at OUT falls to about 2.0 volts, the output of protection circuit 10 represented by curve 110 switches so as to turn pull up transistor M1 back on so that the output at OUT remains at about 2.0 volts, the equivalent of the logic HIGH signal desired at OUT as represented by curve 120. On the other hand, the output of the prior protection circuit represented by curve 130 remains in a state that keeps the pull up transistor off throughout the transition from the overvoltage condition. Only when the potential at OUT drops to about 0.0 volt—a logic LOW condition—does the prior-art protection circuit begin to react such that the potential at OUT only begins to move back upward to the equivalent of a logic HIGH. In effect, the protection circuit 10 of the present invention reacts approximately 60 nanosecond faster than the prior protection circuit. As a result, $V_{OH}$ is maintained before, during, and after an overvoltage condition at OUT.

While the invention has been described with reference to particular example embodiments, it is intended to cover all modifications and equivalents within the scope of the following claims.

What is claimed is:

1. An overvoltage protection circuit for maintaining the output state of an output circuit having a pull up transistor, a high-potential supply rail, a low-potential supply rail, and an output node, wherein the overvoltage protection circuit is designed to block current from the output node to the high-potential supply rail when an overvoltage condition exists at the output node, the overvoltage protection circuit comprising:

a. a first protection branch supplied by the high-potential supply rail, wherein said first protection branch includes an output node coupled to a gate of the pull up transistor; and b. a second protection branch supplied by the potential associated with the output node and controlled by the high-potential supply rail, wherein said second protection branch includes an output node coupled to said first protection branch, wherein when an overvoltage condition exists at the output node of the output circuit, said second protection branch is activated so as to switch an output condition of said first protection branch in order to turn off the pull up transistor.

2. The circuit as claimed in claim 1 wherein said first protection branch includes:

a. a first transistor having a high-potential node coupled to the high-potential supply rail, a control node coupled to the output node of the output circuit, and a low-potential node coupled to said output node of said first protection branch;

b. a resistance device coupled in parallel with said first transistor; and c. a second transistor having a low-potential node coupled to the low-potential supply rail, a high-potential node coupled to said output node of said first protection branch, and a control node coupled to said output of said second protection branch.

3. The circuit as claimed in claim 2 wherein said second protection branch includes:

a. a first transistor having a high-potential node coupled to the output node of the output circuit, a control node coupled to the high-potential supply rail, and a low-potential node coupled to said output node of said second protection branch; and b. a second transistor having a low-potential node coupled to the low-potential supply rail, and a control node and a high-potential node coupled to said output node of said second protection branch.

4. The circuit as claimed in claim 3 wherein said first transistor of said first protection branch and said first transistor of said second protection branch are PMOS transistors.

5. The circuit as claimed in claim 4 wherein said second transistor of said first protection branch and said second transistor of said second protection branch are NMOS transistors.

6. The circuit as claimed in claim 5 wherein said resistance device of said first protection branch is a resistor.

7. The circuit as claimed in claim 6 further comprising an inverter coupled between said output node of said first protection branch and the gate of the pull up transistor.

8. The circuit as claimed in claim 7 further comprising a current-limiting resistor coupled between said first transistor and said second transistor of said second protection branch.

9. The circuit as claimed in claim 1 further comprising a control logic gate coupled between the gate of the pull up transistor and said output of said first protection branch, wherein said control logic gate is designed to pass to the gate of the pull up transistor the higher of the potential of the high-potential supply rail and a potential on the output node.

* * * * *